(12) United States Patent
Joardar et al.

(10) Patent No.: US 11,152,341 B2
(45) Date of Patent: Oct. 19, 2021

(54) POWER MODULE INCLUDING A POWER TRANSISTOR AND TWO SENSE TRANSISTORS

(71) Applicant: TEXAS INSTRUMENTS INCORPORATED, Dallas, TX (US)

(72) Inventors: Kuntal Joardar, Plano, TX (US); Min Chu, Plano, TX (US); Vijay Krishnamurthy, Santa Clara, CA (US); Tikno Harjono, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 280 days.

(21) Appl. No.: 16/460,870

(22) Filed: Jul. 2, 2019

(65) Prior Publication Data

US 2021/0005587 A1 Jan. 7, 2021

(51) Int. Cl.
*H01L 25/07* (2006.01)
*H01L 25/16* (2006.01)
*G01R 31/28* (2006.01)
*G11C 11/4074* (2006.01)
*H01L 29/66* (2006.01)

(52) U.S. Cl.
CPC .......... *H01L 25/162* (2013.01); *G01R 31/28* (2013.01); *G11C 11/4074* (2013.01); *H01L 25/072* (2013.01); *H01L 29/6659* (2013.01)

(58) Field of Classification Search
CPC ............... H01L 25/0655; H01L 25/072; H01L 25/0753; H01L 25/162; H01L 29/6659; H01L 29/0696; H01L 29/7815; H01L 29/0653; G01R 31/28; G01R 19/16552; G01R 19/16519; G11C 11/4074
See application file for complete search history.

(56) References Cited

U.S. PATENT DOCUMENTS

| | | | |
|---|---|---|---|
| 10,366,987 B2 | 7/2019 | Baldwin et al. | |
| 2016/0178670 A1* | 6/2016 | Bernacchia | ....... H01L 29/41741 324/76.11 |
| 2017/0030948 A1 | 2/2017 | Baldwin et al. | |

\* cited by examiner

*Primary Examiner* — Tucker J Wright
(74) *Attorney, Agent, or Firm* — Andrew R. Ralston; Charles A. Brill; Frank D. Cimino

(57) ABSTRACT

In some examples, an integrated circuit includes a plurality of power modules formed on a substrate, including a first power module located between second and third power modules. The first power module is configured to conduct a load current, and includes a power transistor and first and second sense transistors. The first sense transistor is disposed at a first position between the second power module and a central axis of the first power module, and the second sense transistor is disposed at a second position between the third power module and the central axis. The first sense transistor is configured to conduct a first sense current; and the second sense transistor is configured to conduct a second sense current. The first and second sense transistors are configured to direct the first and second sense currents toward a measurement circuit that is configured to determine a derived sense current indicative of the load current.

20 Claims, 7 Drawing Sheets

POWER MODULE INCLUDING A POWER TRANSISTOR AND TWO SENSE TRANSISTORS

SUMMARY

In accordance with some examples of the disclosure, an integrated circuit includes a plurality of power modules formed on a substrate, including a first power module located between second and third power modules. The first power module includes a power transistor and first and second sense transistors. The power transistor is configured to conduct a load current. The first sense transistor is coupled to the power transistor and disposed at a first position between the second power module and a central axis of the first power module. The second sense transistor is coupled to the power transistor and disposed at a second position between the third power module and the central axis. The first sense transistor is configured to conduct a first sense current indicative of the load current; and the second sense transistor is configured to conduct a second sense current indicative of the load current. The first and second sense transistors are configured to direct the respective first sense current and second sense current toward a measurement circuit that is configured to determine from the first and second sense currents a derived sense current.

In accordance with some examples of the disclosure, an electronic device includes first, second and third power modules formed on a semiconductor substrate, the first power module being located between the second and third power modules. The first power module includes a first power transistor having a central axis and a lateral extent defined by a source terminal structure. A first sense transistor includes a first gate and is located within the lateral extent of the first power transistor at a first position between the central axis and the second power module. A second sense transistor includes a second gate and is located within the lateral extent of the first power transistor at a second position between the central axis and the third power transistor. The first and second sense transistors are configured to provide respective first and second sense signals indicative of a drive current of the first power transistor. A first terminal of the first power transistor, a first terminal of the first sense transistor, and a first terminal of the second sense transistors are connected to a common terminal located on a backside of the substrate. A gate of the first power transistor, a gate of the first sense transistor, and a gate of the second sense transistor are connected to a common gate node. A second terminal of the first sense transistor and a second terminal of the second sense transistor are connected to a measurement circuit. The measurement circuit is configured to determine a derived sense signal indicative of the drive current of the first power transistor based on the first sense signal and the second sense signal.

In accordance with some examples of this disclosure, a method of forming an integrated circuit comprises locating a plurality of power modules on a substrate, including a first power module located between second and third power modules, wherein the first power module comprises a power transistor configured to conduct a load current. The method includes determining a first position within the first power module at which a first voltage is induced by a current through the second power module. The method further includes determining a second position within the first power module at which a second voltage is induced by a current through the second power module. The method then includes locating at the first position a first sense transistor configured to conduct a first sense current indicative of the load current; and locating at the second position a second sense transistor configured to conduct a second sense current indicative of the load current.

BRIEF DESCRIPTION OF THE DRAWINGS

For a detailed description of various examples, reference will now be made to the accompanying drawings in which.

DETAILED DESCRIPTION

Figure 1A:
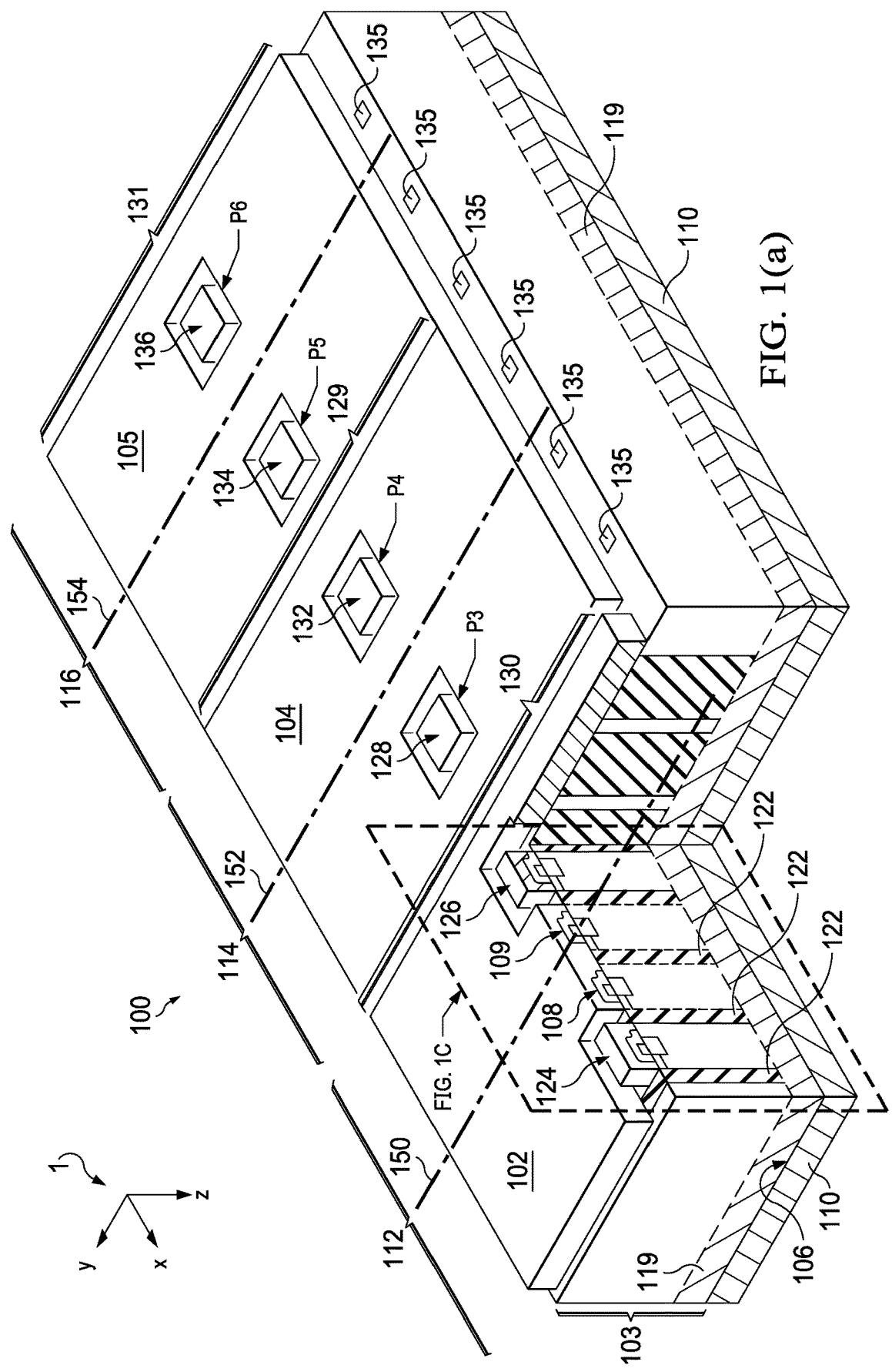
FIG. 1(a) depicts a three dimensional (3D) perspective view of an illustrative electronic device, in accordance with various examples.

The present disclosure relates to electronic devices that include power modules providing large magnitude load currents (e.g., 1 A, 10 A) to loads coupled to the power modules. Each of these power modules includes a transistor pair, where the transistor pair comprises a power transistor and a sense transistor. The power transistor conducts a load current to the load coupled to its corresponding power module, and the sense transistor samples the load current for monitoring and controlling purposes. The current sampled by the sense transistor is sometimes referred to as a sense current, and the sense and power transistors are designed such that the sense current relates to the load current by a multiplicative factor. (The multiplicative factor is sometimes referred to as a sense ratio.) Each of the power modules generally couples to a measurement circuit, and the measurement circuits are configured to receive sense currents from their corresponding power modules and calculate the load currents by multiplying the sense ratios corresponding to their power modules.

In some cases, the power and sense transistor pair may assume a vertical transistor design, and assuming such a transistor design forces a semiconductor substrate in which the power module is fabricated to act as a common transistor terminal for both the power and sense transistor pair. For example, if both the power and sense transistors are n-channel MOSFETs, the common semiconductor substrate acts as either a common drain or source terminal.

When sold to a customer, the power modules are typically packaged together in a single unit. In such cases, the power modules may assume a similar transistor design, are fabricated on the same semiconductor substrate, and share a common terminal. In the case where the power modules assume a vertical transistor design, they may share either the drain or the source terminal. Having a common terminal between multiple power modules may form an unwanted connection (also referred to as soft-connection) between adjacent power modules. The soft-connection may be particularly problematic in cases where one power module conducts a load current of disproportionate magnitude relative to a load current conducted by a power module fabricated laterally adjacent to it. For example, assume that first and second power modules are fabricated adjacent to each other on the same semiconductor substrate, where the first power module conducts a high-magnitude load current (e.g., 10 A) and the second power module conducts a relatively low-magnitude load current (e.g., 0.1 A). In such a scenario, the load current of the first power module alters the potential distribution of the second power module conducting. This disturbance in the potential distribution—which is also referred to as crosstalk—alters the sense current of the second power module conducting the lower-magnitude current. The altered sense current produces an erroneous load current value. Thus, systems and methods are needed to mitigate the crosstalk mentioned above issue.

Accordingly, systems and methods disclosed herein mitigate the crosstalk mentioned above issue by providing a power module including two sense transistors, where the two sense transistors are advantageously positioned in the power module to offset each other's crosstalk effect. Stated another way, the two sense transistors are positioned in the power module such that crosstalk from an adjacent power module increases the magnitude of the sense current in sense one transistor and crosstalk from the same adjacent power module decreases the sense current in the other sense transistor by equal magnitude. This equal and opposite change in sense currents is utilized, for example, in the measurement circuit, to offset the crosstalk effect and to calculate a more accurate value of the load current.

Reference will now be made in detail to the examples illustrated in the accompanying figures. Wherever possible, the same reference numerals are used in the figures and the description refers to the same or like parts. In the figures, the shape and thickness of one example may be exaggerated for clarity and convenience. Elements not specifically shown or described may take various forms. Further, when a layer is referred to as being on another layer or "on" a substrate, it may be directly on the other layer or on the substrate, or intervening layers may also be present.

FIG. 1(a) depicts a three-dimensional perspective view of an illustrative electronic device 100 that includes power modules 112, 114, and 116, which are formed in and/or over a semiconductor substrate 103. The electronic device 100 shown in FIG. 1(a) depicts three power modules. In other examples, the number of power modules may vary. FIG. 1(a) also illustrates a coordinate system 1, where the X-axis and the Y-axis of the coordinate system 1 each lie in the plane of the top surface of the device 100, and the Z-axis projects normal to the device 100 surface.

FIG. 1(a) further depicts a cross-sectional side-view of the power module 112, which includes a power transistor 130. The power transistor 130 may assume a multi-finger layout in that one power transistor is split into smaller transistors located in lanes between adjacent isolation structures 122 and electrically coupled to one another in parallel. For example, as depicted in the illustrative electronic device 100, the power transistor 130 includes transistors 108, 109, as well as transistors in the adjacent lanes (hidden in the section as shown). The transistors 108, 109 (and hidden transistors) electrically couple to one another in parallel when operating. In the example shown in FIG. 1(a), the power transistor 130 is depicted to include four transistor lanes; however, in other examples, the power transistor 130 may include a different number of lanes.

In some examples, the number of split transistors may be a function of a rated load current of the power module, where the rated load current is the current for which the power module has been designed. For example, assume that the power transistor 130 with two split transistors conducts 0.1 A load current. The power transistor 130 may include a larger number of split transistors in examples where the power transistor 130 conducts a higher magnitude load current (e.g., 5 A). The power transistor 130, in one example, is an n-channel metal-oxide-semiconductor-field-effect-transistor (nMOSFET), and thus, as a corollary, the transistors 108, 109 are also nMOSFETs.

Similar to the power module 112, the power modules 114, 116 comprise power transistors 129, 131, respectively. The description of the power transistor 130 applies to the power transistors 129, 131. In one example, the power transistors 129, 131 may also assume a multi-finger layout and are nMOSFETs.

The power module 112 further includes sense transistors 124, 126 that are coupled to the power transistor 130 via their gate terminals (not expressly depicted in FIG. 1(a), but is depicted and described below). The sense transistors 124, 126 may assume the same transistor type, polarity, and orientation as the power transistor 130, which, in the instant example, is a vertical nMOSFET transistor. The sense transistor 124 is located at a position P1 relative to a central axis 150 of the power module 112, the central axis 150 being parallel to Y-axis and the semiconductor substrate 103, e.g. oriented normal to a line connecting the geometric centers of the sense transistors 124, 126. The central axis 150 does not necessarily need to be limited to the exact geometric center of the power module 112. In one example, the sense transistor 124 is fabricated such that the power transistor 130 is laterally adjacent to the sense transistor 124 on at least three sides of the sense transistor 124, with two of the sides being opposite from each other. Similarly, the sense transistor 126 is located at a position P2 relative to the central axis 150, such that the power transistor 130 is laterally adjacent to the sense transistor 126 on at least three sides of the sense transistor 126, with two of the sides being opposite from each other. The isolation structures 122 isolate transistors 108, 109 and the sense transistors 124, 126 from each other. In some examples, isolation structures 122 include a dielectric material, such as silicon dioxide.

Similarly, power module 114 includes sense transistors 128, 132, and power module 116 includes sense transistors 134, 136. The power transistor 129 couples to the sense transistors 128 and 132 via their gate terminals (described below), and the power transistor 131 couples to the sense transistors 134, 136 via their gate terminals (described below). The sense transistors 128, 132, 134, 136 may assume the same transistor type, polarity, and orientation as their respective power transistors 129, 131 which, in the instant example, is a vertical nMOSFET transistor. The sense transistors 128, 132 are located at positions P3 and P4, respectively relative to a central axis 152 of the power module 114 and are fabricated such that the power transistor 129 is laterally adjacent to the sense transistors 128, 132 on at least three sides, with two of the sides being opposite from each other. The sense transistors 134, 136 are located at positions P5 and P6, respectively relative to a central axis 154 of the power module 116 and are fabricated such that the power transistor 131 is laterally adjacent to the sense transistors 134, 136 on at least three sides, with two of the sides being opposite from each other. The central axes 152, 154 being parallel to Y-axis and the semiconductor substrate 103. The central axes 152, 154 do not necessarily need to be limited to the exact geometric center of the power modules 114, 116, respectively. In one example, the distance between the central axes 150, 152 is substantially similar to the distance between the central axes 152, 154.

The positions P1-P6 of the sense transistors 124, 126, 128, 132, 134, 136 are selected to offset the crosstalk effect due to their respective adjacent power modules. In particular, the positions P1-P6 are selected by estimating a distribution of the electrical potential within the semiconductor substrate 103 and determining the average potential distribution of the semiconductor substrate 103. The method of selecting the positions P1-P6 is described below in FIG. 1(*b*). The potential distribution may be estimated by solving Poisson's equation for the specific orientation of the power modules 112, 114, 116. The estimated potential distribution obtained by solving Poisson's equation may be further refined by using a three-dimensional modeling software program of the type commonly known as Technology Computer Aided Design (TCAD). Such programs are commercially available at the time of this disclosure from several vendors, including, but not limited to, Synopsys and Silvaco. The solution of Poisson's equation may provide a convenient starting point for the modeling software program. Use of the modeling software program may provide a more detailed estimate of the potential distribution.

Figure 1B:
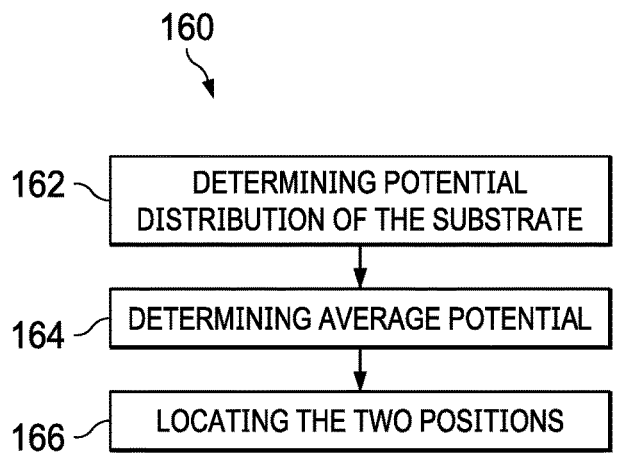
FIG. 1(b) depicts an illustrative method to determine the positions of sense transistors, in accordance with various examples.
Figure 1C:
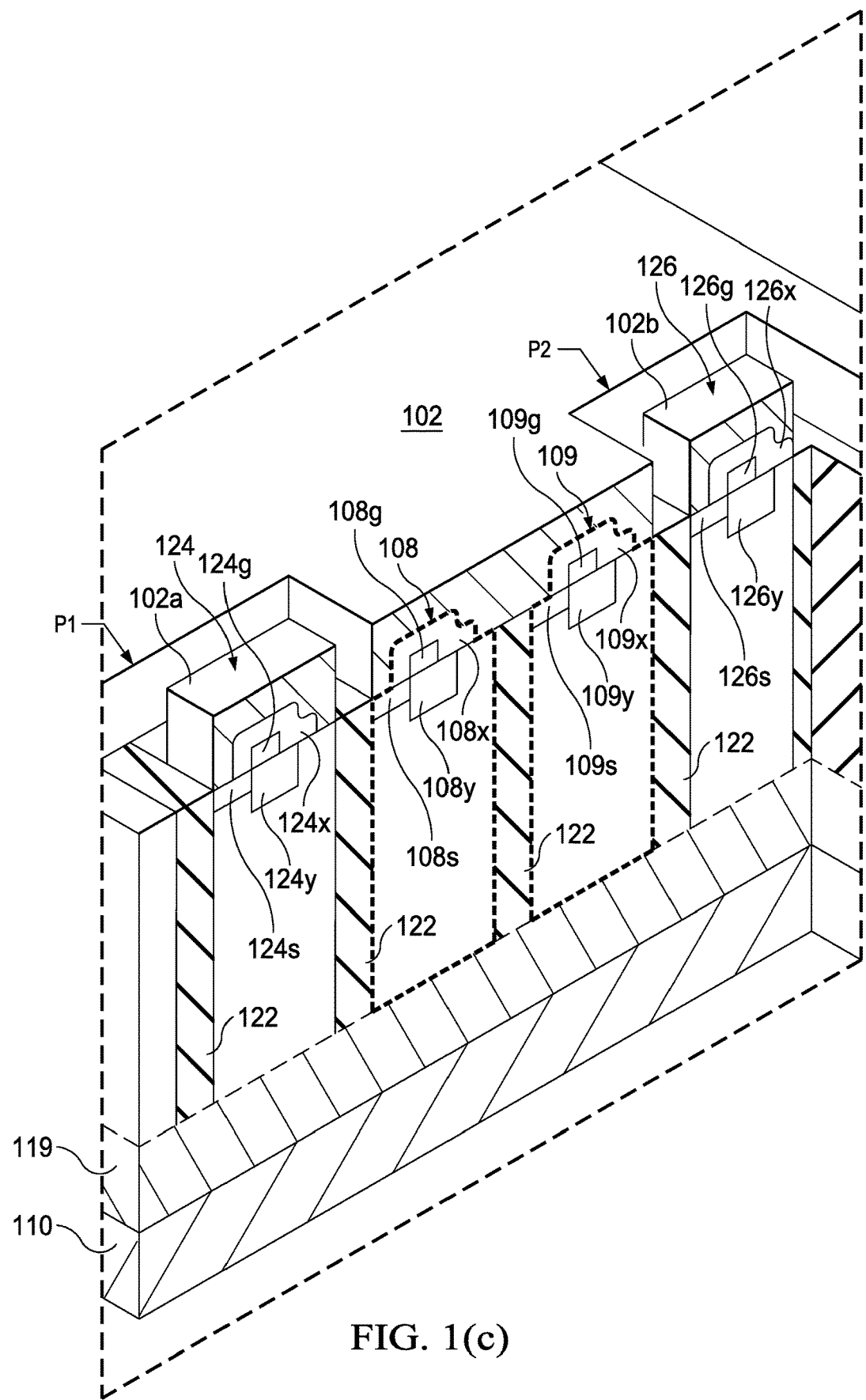
FIG. 1(c) depicts a portion of the 3D perspective view of FIG. 1(a), in accordance with various examples.

Referring briefly to FIG. 1(*b*), an illustrative method 160 to determine the positions of sense transistors that enable offsetting the crosstalk effect due to adjacent power modules is shown. Method 160 is described with respect to FIG. 1(*a*). For illustrative purposes, the method 160 is used to determine the positions P3 and P4, and, for simplicity's sake, it is assumed that the crosstalk is introduced by only one of the adjacent power modules, for example, by the power module 112. The above described crosstalk arrangement can be obtained by coupling power modules 112, 114 to similar loads (e.g., loads having similar ohmic values) such that both the power modules 112 and 114 provide similar load currents to their loads, and power module 116 is coupled to a load with higher ohmic value such that the power module 116 provides a significantly higher load current to its load.

In such an example, the positions P3 and P4 can be determined by first determining the potential distribution of the semiconductor substrate 103 as a function of x, y, z positions using a 3D Poisson solver software or TCAD software (block 162). The method 160 may then proceed to block 164 that includes determining, using the same software, an average potential of a portion of the semiconductor substrate 103 upon which the power module 114 is formed. The method 160 may then proceed to block 166 that includes locating, using the same software, two positions (e.g., positions P3 and P4) on that portion of the semiconductor substrate 103 where the value of a local potential minus the average potential have equal magnitudes, but opposite signs. For example, the software may first determine the local potential of the semiconductor substrate 103 from side to side in lines from top to bottom to find two positions where the sum of the local potentials of the two positions minus twice the average potential of the portion of the semiconductor substrate 103 is about zero. Such positions offset the crosstalk effect. In some examples, the positions P3 and P4 calculated by the software are symmetrical relative to the central axis 152. In some examples, the positions P3 and P4 may be unsymmetrical relative to the central axis 152. Examples of symmetrical and unsymmetrical positions are depicted below in FIG. 5.

Method 160 can be performed using a computer system, which is not explicitly shown in this disclosure. The computer system, in one example, includes a central processing unit (CPU) and storage (e.g., random access memory (RAM), read-only memory (ROM)), which may include any suitable type of non-transitory computer-readable medium storing machine-executable instructions that run on the TCAD software. The machine-executable instructions, when executed by the CPU, cause the CPU to perform one or more of the actions attributed herein to the computer system. The computer system may additionally include an input device (e.g., touch screen, mouse, keyboard, audio input) and an output device (e.g., a display, audio output) via which a user may interact with the computer system. The computer system also may comprise a network interface via which the computer system may communicate with one or more other computer systems that are either co-located with the computer system or are located in one or more other locations (e.g., a distributed computer system).

Refer back to FIG. 1(*a*). As noted above, each of the power transistors 130, 129, 131, and their respective sense transistors assume a vertical transistor structure and share the semiconductor substrate 103. A bottom portion of the semiconductor substrate 103 acts as a common drain region 119 for each of these power and sense transistors. The electronic device 100 includes a metal contact plate 110 that couples to the first surface 106 and makes electrical contact with the common drain region 119.

FIG. 1(*c*) depicts a portion of the device 100. The portion is a cross-sectional side-view of the power module 112, which is now described briefly. The cross-sectional side-view of the power module 112 depicts the transistor 108, which further depicts a gate electrode 108*g*, a source region 108*s*, insulator 108*x*, body region 108*y*, and the common drain region 119. The gate electrode 108*g*, the source region 108*s*, insulator 108*x*, and body region 108*y* extend—parallel to the Y-axis—from one end of the power module 112 to the other end. Similarly, a cross-section of the transistor 109 depicts a gate electrode 109*g*, a source region 109*s*, insulator 109*x*, body region 109*y*, and the common drain region 119. Further, similar to the transistor 108, the gate electrode 109*g*, the source region 109*s*, insulator 109*x*, body region 109*y* extend—parallel to the Y-axis—from one end of the power module 112 to the other end.

The cross-section of the sense transistor 124 depicts a gate electrode 124*g*, a source region 124*s*, insulator 124*x*, body region 124*y*, and the common drain region 119. The cross-section of the sense transistor 126 depicts a gate electrode 126*g*, a source region 126*s*, insulator 126*x*, body region 126*y*, and the common drain region 119. The source regions 108*s*, 109*s* of the power transistor 130, and source regions of the hidden transistors in adjacent lanes, are contacted by a source terminal 102, which, in one example, is manifested as a metal layer extending over a top side of the semiconductor substrate 103 (as depicted in FIG. 1(*a*)). The source terminal 102 may be formed such that the source terminal 102 contacts the source regions 108*s*, 109*s*, and do not contact the source regions of the sense transistors 124, 126. The source regions 124*s*, 126*s* may be contacted by source terminals 102*a*, 102*b*, respectively. In effect, the sense transistor 124 is isolated from the surrounding power transistor 130 by a trench around the transistor 124 that physically insulates the source terminal 102*a* from the source terminal 102, and the gate 124*g* from the (hidden) gates of the other transistors in the same lane. The sense transistor 126 is similarly isolated from the power transistor 130. Similarly, source terminals 104 and 105 (FIG. 1(*a*)) contact the source regions of the transistors that form their respective power transistors 129, 131, while the source terminals of the sense transistors 128, 132, 134, 136 are physically isolated from the respective surrounding source terminals 104 and 105. The interconnections between the source, gate, and drain terminals of the sense and power transistors of the power modules 112, 114, 116 are further described in FIGS. 2(a) and 2(b).

Refer back to FIG. 1(a). The electronic device 100 may include pads 135, such as bond pads or bump pads, providing connections to the sources and gates of the power and sense transistors of the power modules 112, 114, 116.

Figure 2A:
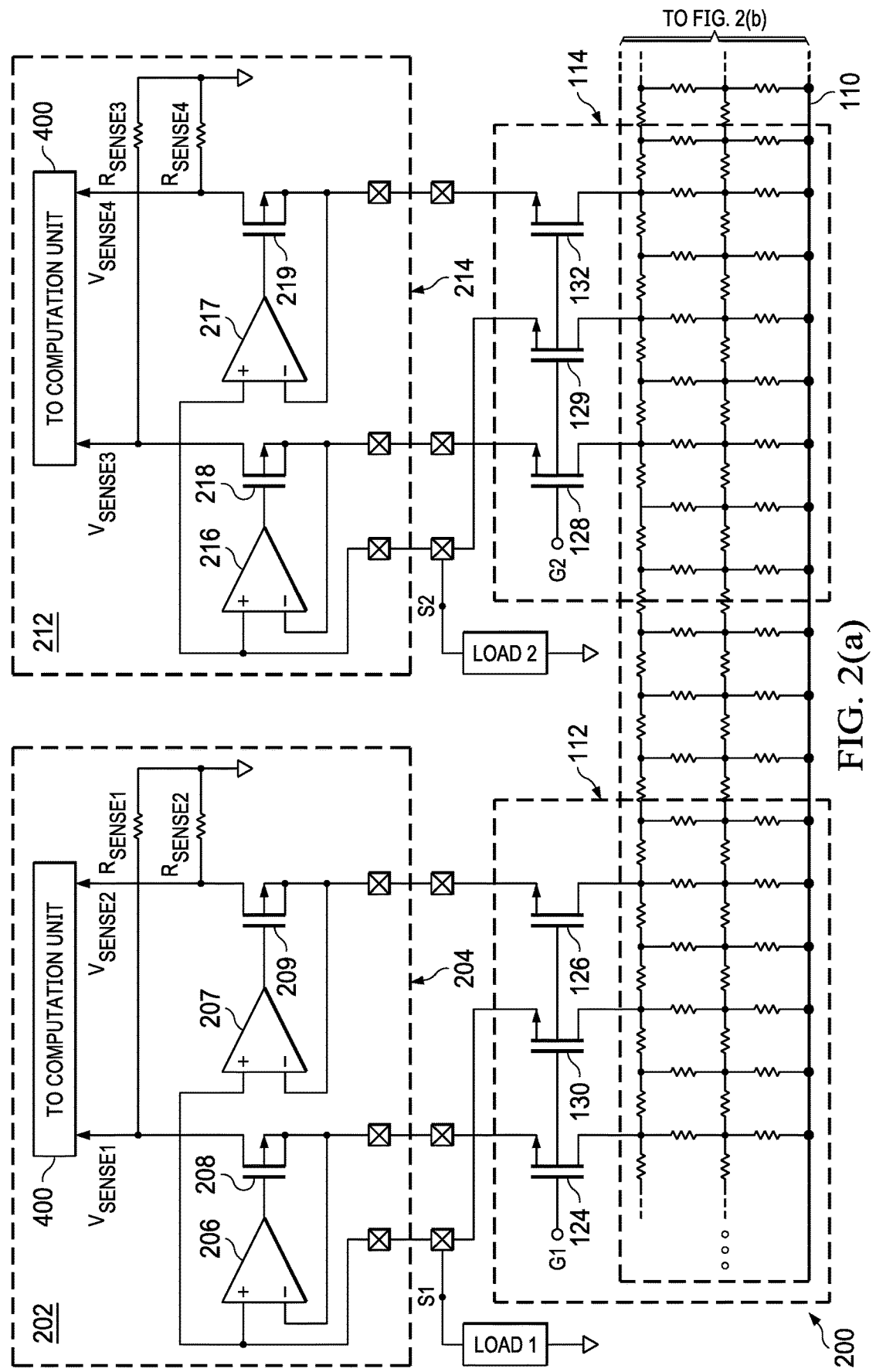
FIGS. 2(a) and 2(b) depict an equivalent circuit of the power module, in accordance with various examples.
Figure 2B:
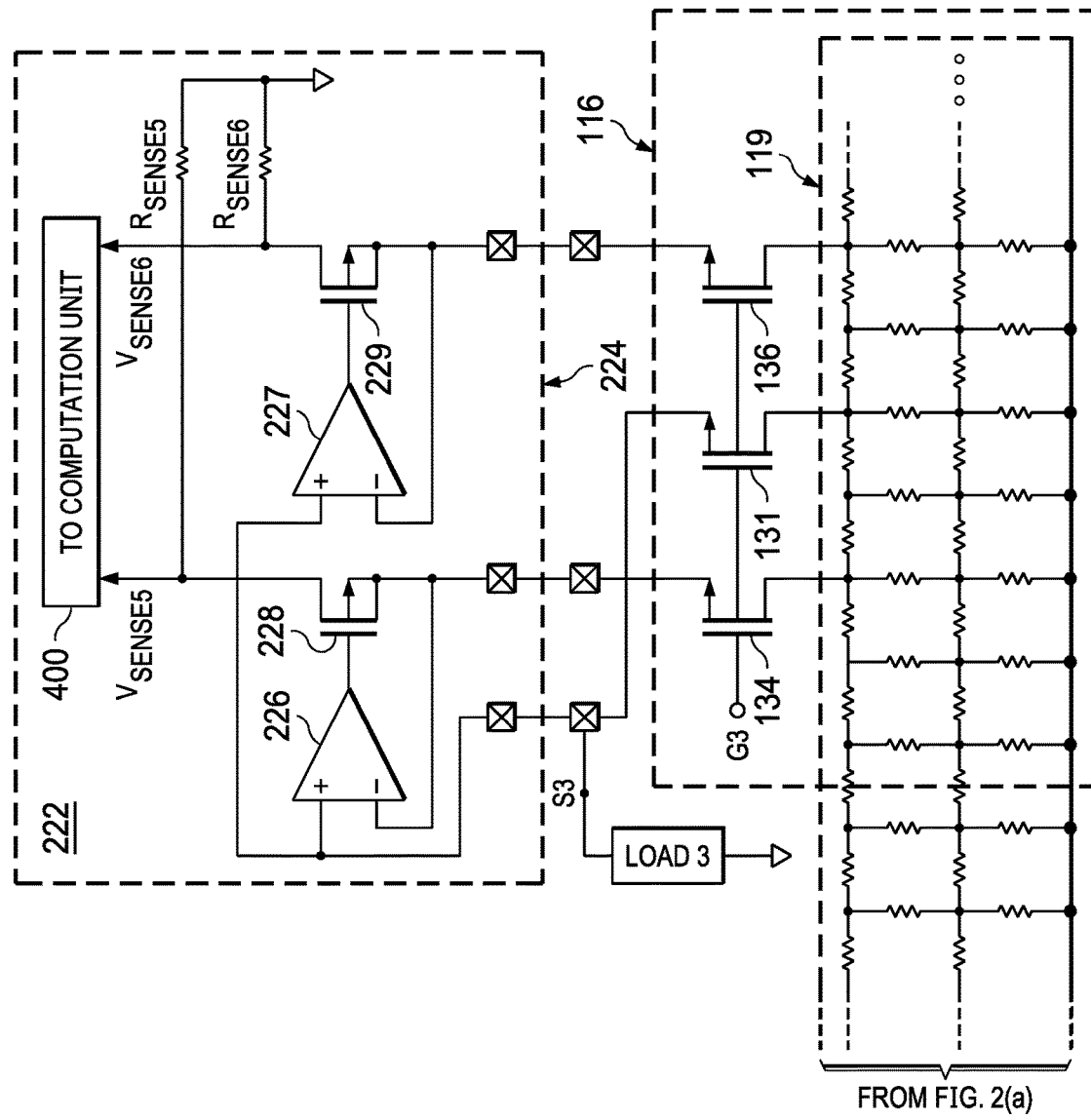

Refer now to FIGS. 2(a) and 2(b), which together depict an equivalent circuit 200 of the electronic device 100. The equivalent circuit 200 includes the equivalent circuits of the power modules 112, 114 (FIG. 2(a), and 116 (FIG. 2(b)). The equivalent circuit 200 also depicts measurement circuits 204, 214, and 224 that couple to the power modules 112, 114, and 116, respectively.

The equivalent circuit of power module 112 depicts the power transistor 130 coupled to sense transistors 124 and 126 via their respective gate terminals. The source terminals of the sense transistors 124 and 126 are coupled to the measurement circuit 204. The source terminal of the power transistor 130 couples to a load that is labeled as load 1. The drain terminals of the power transistor 130 and sense transistors 124, 126 are shown to couple the common drain region 119, which further couples to the metal contact plate 110. The common drain region 119 is depicted as a bulk resistor, which is illustrated as multiple resistors connected in series and parallel.

The measurement circuits 204, 214, 224 may optionally be formed as separate units, meaning that the measurement circuits 204, 214, 224 may be located on separate semiconductor substrates 202, 212. 222, and may further optionally be located on separate substrates from the power modules 112, 114, and 116. However, in some examples, one or more of the measurement circuits 204, 214, 224 and power modules 112, 114, and 116 may be fabricated on the same semiconductor substrate.

The measurement circuit 204 includes operational amplifiers 206 and 207, one for each of the sense transistors 124 and 126, respectively. The operational amplifiers 206 and 207 may be configured in a negative feedback configuration, where positive terminals of the operational amplifiers 206 and 207 are coupled to the source terminal of the power transistor 130 and negative terminals of the operational amplifiers 206 and 207 are coupled to the respective source terminals of the sense transistor 124 and 126. The measurement circuit 204 may also include transistors 208 and 209. The source terminals of the transistors 208 and 209 are coupled to the negative terminal of the operational amplifiers 206 and 207, respectively. The source terminals of the transistors 208 and 209 are also coupled to the respective source terminals of the sense transistors 124 and 126. The drain terminals of the transistors 208 and 209 couple to sense resistors $R_{sense1}$ and $R_{sense2}$, respectively. The drain terminals of the transistor 208 and 209 also couple to a computation unit 400 (FIG. 4) that converts the analog signals received from the drain terminals of the transistors 208 and 209 into digital signals. These digital signals are further processed to compute the load current of the power module 112 by, in one example, using an average/weighted average technique.

The operation of the power module 112 is now described. As the power transistor 130 is turned on (by a gate signal sent via a controller (not expressly shown)), the power transistor 130 conducts a load current. The sense transistors 124 and 126 are coupled to the power transistor 130 such that currents (which are referred to as sense currents) mirror the load current flow from the sense transistors 124 and 126.

The operational amplifiers 206 and 207 are assumed to have low input offset voltages and high input impedances. Thus the sense currents flowing through the sense transistors 124 and 126 continue flowing un-attenuated through the transistors 208 and 209, respectively as $I_{sense\_124}$ and $I_{sense\_126}$, respectively. The transistor 208 is biased such that the transistor 208 operates in a saturation region and the sense currents flowing through the transistor 208 are dependent only on its gate voltage. The feedback architecture ensures that the gate voltages of transistors 208 and 209 are high enough to turn on the transistors 208 and 209 to conduct $I_{sense\_124}$ and $I_{sense\_126}$, respectively. The sense currents $I_{sense\_124}$ and $I_{sense\_126}$ flow through the sense resistors $R_{sense1}$ and $R_{sense2}$, respectively, and the resulting voltages $V_{sense1}$ and $V_{sense2}$ are provided to a computational unit 400, which is described ahead.

Figure 4:
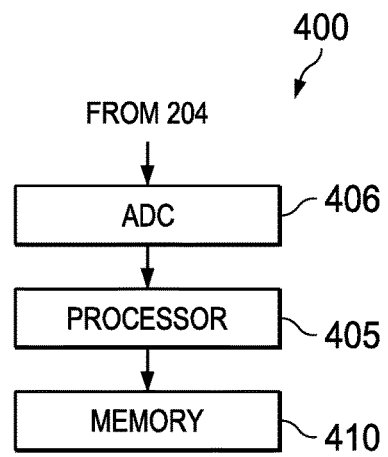
FIG. 4 depicts an illustrative computation unit, in accordance with various examples.

Briefly referring now to FIG. 4, an illustrative computation unit 400 is shown. The computation unit 400 facilitates computing a corrected sense current that is substantially free of crosstalk. The corrected sense current, in turn, facilitates computing a more accurate load current of the power transistor 130. The computation unit 400 is described as receiving the sense voltages $V_{sense1}$ and $V_{sense2}$ from the measurement circuit 204, which description may also be understood to apply to the sense voltages produced by the measurement circuits 214 and 224.

The computation unit 400, in one example, includes an analog-to-digital converter (ADC) 406, a processing unit (hereinafter "processor") 405 coupled to the ADC 406, a memory unit (hereinafter "memory") 410 coupled to the processor 405. In some examples, memory 410 includes RAM (random access memory), and ROM (read-only memory). In some examples, memory 410 includes any suitable type of non-transitory computer-readable medium storing executable instructions. The executable instructions, when executed by the processor 405, cause the processor 405 to perform one or more of the actions attributed herein to the computation unit 400. In some examples, the ADC 406 is configured to digitize the voltage equivalents $V_{sense1}$ and $V_{sense2}$ of $I_{sense\_124}$ and $I_{sense\_126}$, respectively. These digitized values, in some examples, are further processed in the processor 405 to compute a magnitude of the corrected sense current.

Figure 3A:
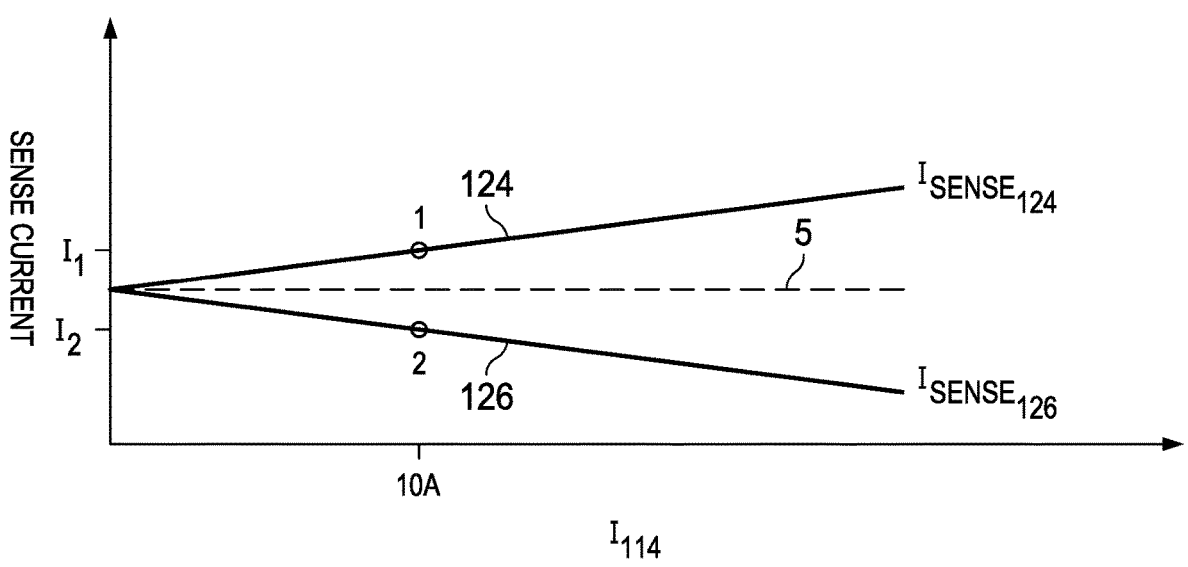
FIGS. 3(a)-3(c) depicts an illustrative graph showing an expected response of sense currents due to crosstalk, in accordance with various examples.

Assume that a large-magnitude load current flows through the adjacent power module, e.g., the power module 114. The positions of the sense transistors 124 and 126 are selected such that the effect of crosstalk is equal and opposite. For example, the sense current $I_{sense\_124}$ increases to the same degree as the sense current $I_{sense\_126}$ decreases because of the advantageous positions of their respective sense transistors. The increase and decrease of the sense currents $I_{sense\_124}$ and $I_{sense\_126}$ can be readily understood using FIG. 3(a), which depicts an illustrative graph showing an expected response of sense currents due to crosstalk. The horizontal axis quantifies the load current flowing through the power module 114, the vertical axis quantifies the sense current of the power module 112, and the dotted line 5 refers to the ideal sense current (e.g., sense current in a scenario where there is no crosstalk) that can accurately extrapolate the load current flowing in the power module 112. As the load current flowing through the power module 114 increases, the sense current $I_{sense\_124}$ linearly increases to a first value, and the sense current $I_{sense\_126}$ linearly decreases to a second value, where the first and second values have substantially similar magnitudes. Stated another way, the positions P1 and P2 of the sense transistors 124 and 126 are selected such that the linear increase and decrease occurs with the same degree (or slope), but with an opposite sign. In a specific nonlimiting example, when the power module 114 produces 10 A of current the sense current $I_{sense\_124}$ has a value $1_1$, and the sense current $I_{sense\_126}$ has a value as $1_2$. These currents (or their digitized voltage equivalents) are further processed in the processor 405 by applying a mathematical function to offset the crosstalk effect. In one example, the processor 405 applies an average function. In other examples, the processor 405 applies a weighted average function. In another example, the computation unit 400 may be implemented using analog circuitry.

Refer back to FIGS. 2(a) and 2(b), which further depict power modules 114 and 116 that are coupled to their measurement circuits 214 and 224, respectively. The power module 114 includes the power transistor 129 coupled to a load that is labeled as load 2. The power transistor 129 couples to the sense transistors 128 and 132 in the same manner as did the power and sense transistors of the power module 112. Similarly, the power module 116 includes the power transistor 131 coupled to a load labeled as load 3. The power transistor 131 couples to the sense transistors 134 and 136 in the same manner as did the power and sense transistors of the power module 112. Similar to the measurement circuit 204, the measurement circuit 214 includes operational amplifiers 216 and 217, transistors 218, 219, and sense resistors labeled as $R_{sense3}$ and $R_{sense4}$; and the measurement circuit 224 includes operational amplifiers 226 and 227, transistors 228 and 229, and sense resistors labeled as $R_{sense5}$ and $R_{sense6}$. The description and the interconnections of the measurement circuit 204 with its power module 112 apply to the description and interconnections of the measurement circuits 214 and 224 with their respective power modules 114 and 116.

Refer now to the power module 114 and assume that the power transistor 129 conducts a lower current (e.g., 0.1 A) than the power transistors 130, 131 (e.g., 10 A). The positions of the sense transistors 128 and 132 are selected such that the effect of crosstalk due to both the adjacent power modules 112 and 114 is equal and opposite. The equal and opposite effect of crosstalk can readily be understood using FIGS. 3(b) and 3(c).

Figure 3B:
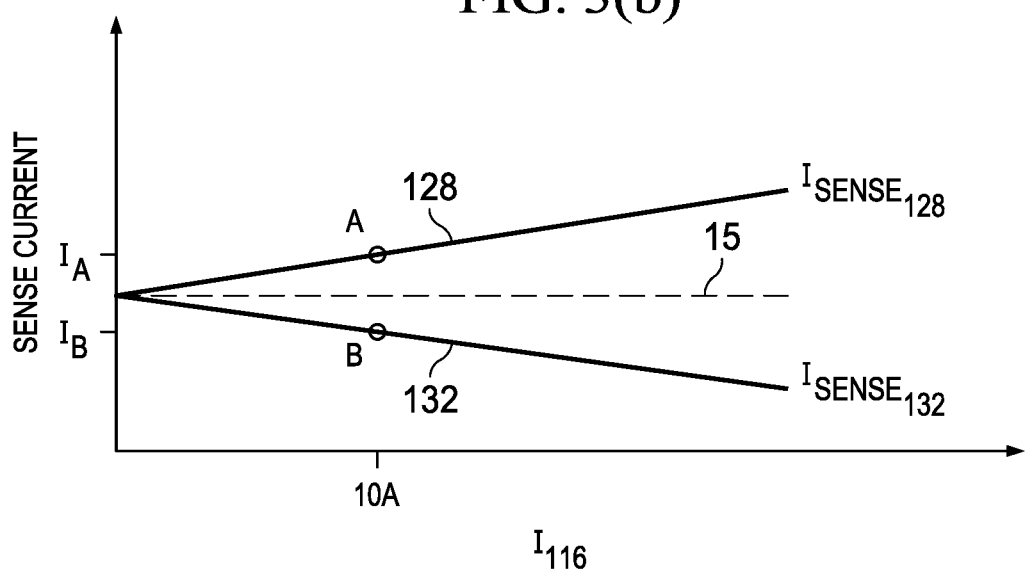

FIG. 3(b) depicts an illustrative graph showing an expected response of sense currents $I_{sense\_128}$ and $I_{sense\_132}$ flowing through the sense transistors 128 and 132 due to crosstalk induced by the load current $I_{116}$ flowing through the power module 116. The horizontal axis quantifies the load current flowing through the power module 116, the vertical axis quantifies the sense current of the power module 114, and the dotted line 15 refers to the ideal sense current (e.g., sense current in a scenario where there is no crosstalk) that can accurately extrapolate the load current flowing in the power module 116. As the load current flowing through the power module 116 increases, the sense current $I_{sense\_128}$ linearly increases to a value $I_A$ at $I_{116}=10$ A, and the sense current $I_{sense\_132}$ linearly decreases to a value $I_B$ at $I_{116}=10$ A. Stated another way, the positions P3 and P4 of the sense transistors 128 and 132 are selected such that the linear increase and decrease occurs with the same degree (or slope), but with an opposite sign.

Figure 3C:
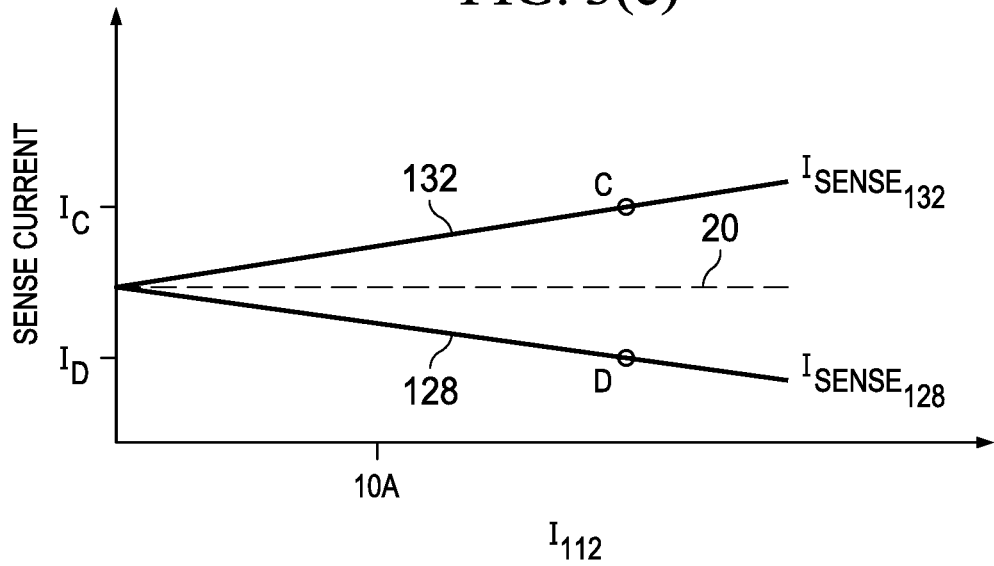

FIG. 3(c) depicts an illustrative graph showing an expected response of sense currents $I_{sense\_128}$ and $I_{sense\_132}$ flowing through the sense transistors 128 and 132 due to crosstalk induced by the load current $I_{112}$ flowing through the power module 112. The horizontal axis quantifies the load current flowing through the power module 112, the vertical axis quantifies the sense current of the power module 114, and the dotted line 20 refers to the ideal sense current (e.g., sense current in a scenario where there is no crosstalk) that can accurately extrapolate the load current flowing in the power module 112. As the load current flowing through the power module 112 increases, the sense current $I_{sense\_128}$ linearly decreases to a value $I_D$ at $I_{116}=10$ A and the sense current $I_{sense\_132}$ linearly increases to a value $I_D$ at $I_{116}=10$ A. Thus, in this case also, the positions P3 and P4 of the sense transistors 128 and 132 facilitate linear increase and decrease of the sense current so as to offset the crosstalk effect. The currents $I_{sense\_128}$ and $I_{sense\_132}$ are further processed in the processor 405 by applying a mathematical function to offset the crosstalk effect.

Similar to the positions P1-P4, the positions P5 and P6 of the power module 116 are selected so as to offset the effect of crosstalk experienced by the sense currents flowing through the sense transistors 134 and 136.

Referring to FIG. 1(a). The positioning of sense transistors within their power modules can be described in another way. For example, the sense transistor 128 of the power module 114 can be viewed to be disposed at the position P3 between the power module 112 and the central axis 152 of the power module 114, and the sense transistor 132 can be viewed to be disposed at the position P4 between the power module 116 and the central axis 152. The sense transistors 128 and 132 conduct sense currents indicative of the load current and may also be deviated due to crosstalk from the adjacent power modules. These sense currents are further directed toward the measurement circuit 204 to determine the corrected sense current that is substantially free from crosstalk. This corrected sense current is then used to compute the load current flowing through the power transistor 129.

Figure 5:
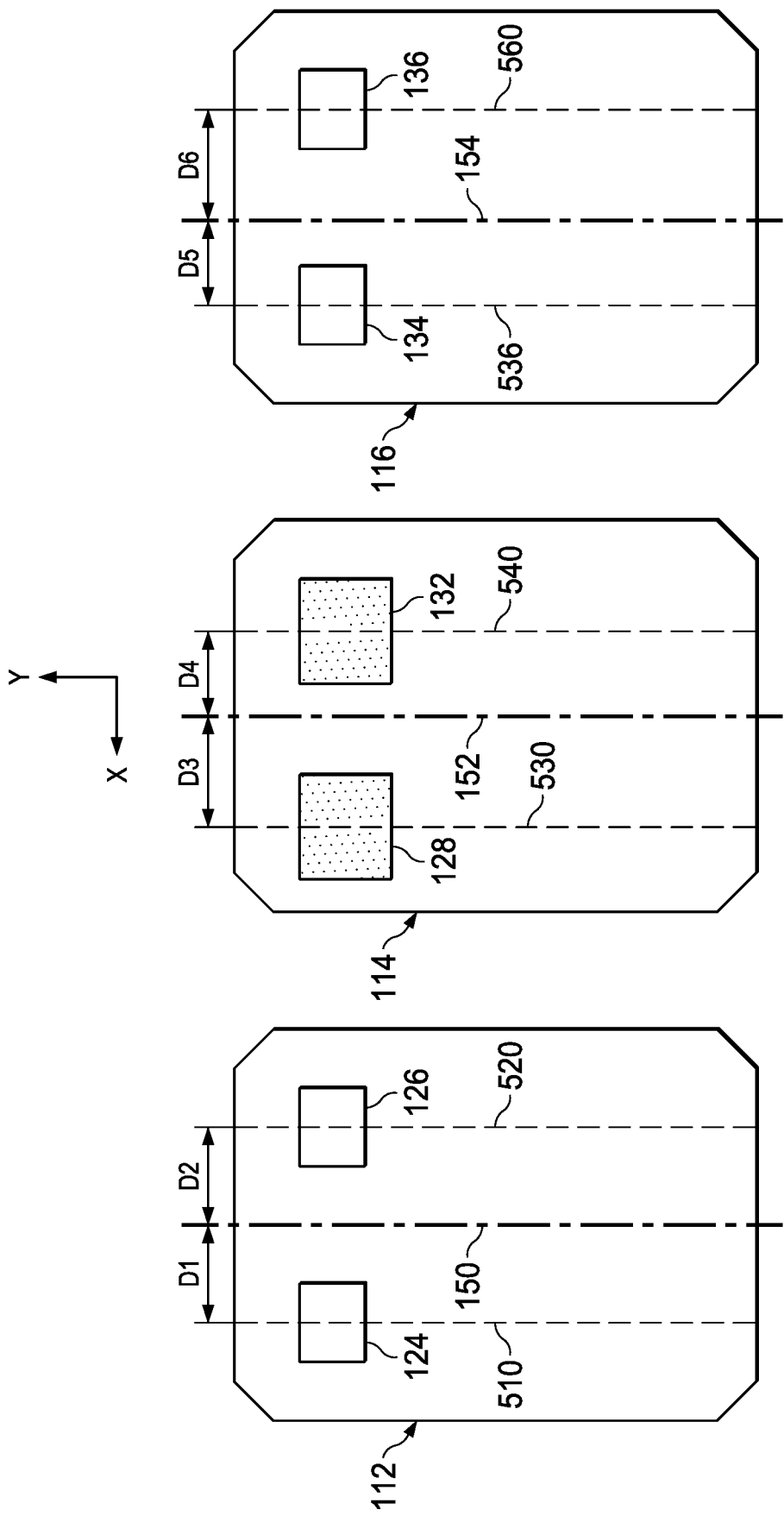
FIG. 5 depicts a top-view of the electronic device, in accordance with various examples.

Referring now to FIG. 5, top-view of the electronic device 100 (FIG. 1(a)) is depicted. FIG. 5 depicts the positions of the sense transistors relative to the central axis of their respective power modules. For example, the sense transistors 124 and 126 are positioned at distances D1 and D2, respectively, relative to the central axis 150. The distances D1 and D2 may be calculated from axes 510 and 520 centered on the sense transistors 124 and 126, respectively. Similarly, the sense transistors 128 and 132 have central axes 530 and 540, respectively, and the sense transistors 128 and 132 are positioned at distances D3 and D4, respectively, relative to the central axis 152. Yet again, the sense transistors 134 and 136 have central axes 550 and 560, respectively, and the sense transistors 134 and 136 are positioned at distances D5 and D6, respectively, relative to the central axis 154. In some examples, sense transistors are symmetrically placed relative to their respective central axis. For example, in power module 112, the sense transistors 124 and 126 are symmetrically placed relative to the central axis 150, so the distances D1 and D2 are about the same. In other examples, where other constraints, such as packaging and bond wire placement is taken into account, the sense transistors may be unsymmetrically placed relative to their respective central axis to reflect asymmetric potentials produced by adjacent power modules. For example, in power module 114, the sense transistors 128 and 132 are unsymmetrically placed relative to the central axis 152, so the distances D3 and D4 are different. In some examples, the crosstalk can be offset using sinkers in the place of sense transistors. A sinker is a direct connection of the operational amplifier to the substrate. In this case, the sinker voltage is measured instead of sense currents.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
   a plurality of power modules formed on a substrate, including a first power module located between second and third power modules, wherein the first power module comprises:
   a power transistor configured to conduct a load current;
   a first sense transistor coupled to the power transistor and disposed at a first position between the second power module and a central axis of the first power module, the first sense transistor configured to conduct a first sense current indicative of the load current; and
   a second sense transistor coupled to the power transistor and disposed at a second position between the third power module and the central axis, the second sense transistor configured to conduct a second sense current indicative of the load current,
   wherein the first and second sense transistors are configured to direct the respective first sense current and second sense current toward a measurement circuit that is configured to determine from the first and second sense currents a derived sense current.

2. The integrated circuit of claim 1, wherein the power transistor, the first sense transistor, and the second sense transistor are each n-metal-oxide-semiconductor field-effect-transistors (nMOSFETs), wherein the substrate is configured as a drain terminal for each of the power modules.

3. The integrated circuit of claim 1, wherein the power transistor, the first sense transistor, and the second sense transistor are each p-metal-oxide-semiconductor field-effect-transistors (pMOSFETs), wherein the substrate is configured as a source terminal for each of the power modules.

4. The integrated circuit of claim 1, wherein each of the power modules is configured to drive a different load.

5. The integrated circuit of claim 1, wherein the measurement circuit is formed on a second substrate.

6. The integrated circuit of claim 1, wherein the first and second positions are substantially equidistant relative to the central axis.

7. The integrated circuit of claim 1, wherein the power transistor assumes multi-finger transistor layout.

8. The integrated circuit of claim 1, wherein the derived sense current is a scaled-down version of the load current.

9. The integrated circuit of claim 1, wherein the first sense transistor is located at the first position such that the first sense current is configured to increase by a first value due to a change of load current of the second power module, and wherein the second sense transistor is placed at the second position such that the second sense current is configured to decrease by a second value due to the change of load current of the second power module.

10. The integrated circuit of claim 9, wherein the first and second values have a substantially similar magnitude.

11. The integrated circuit of claim 9, wherein the derived sense current is an averaged function of the first sense current, first value, second sense current, and second value.

12. An electronic device, comprising:
    first, second and third power modules formed on a semiconductor substrate, the first power module being located between the second and third power modules, wherein the first power module comprises:
    a first power transistor having a central axis and a lateral extent defined by a source terminal structure;
    a first sense transistor having a first gate and being located within the lateral extent of the first power transistor at a first position between the central axis and the second power module, the first sense transistor being configured to provide a first sense signal indicative of a drive current of the first power transistor;
    a second sense transistor having a second gate and being located within the lateral extent of the first power transistor at a second position between the central axis and the third power transistor, the second sense transistor being configured to provide a second sense signal indicative of the drive current of the first power transistor;
    a common terminal, located on a backside of the substrate, to which are connected a first terminal of the first power transistor and a first terminal of the first and second sense transistors;
    a common gate node to which are connected a gate of the first power transistor, a gate of the first sense transistor, and a gate of the second sense transistor; and
    a measurement circuit connected to a second terminal of the first sense transistor and connected to a second terminal of the second sense transistor, the measurement circuit being configured to determine a derived sense signal indicative of the drive current of the first power transistor based on the first sense signal and the second sense signal.

13. The electronic device of claim 12, wherein the first sense transistor is located at the first position such that the first sense signal is configured to increase by a first value due to a change of the drive current of the second power transistor, and wherein the second sense transistor is placed at the second position such that the second sense signal is configured to decrease by a substantially similar value as the first value due to the change of drive current of the second power transistor.

14. The electronic device of claim 13, wherein the derived sense current is an averaged function of the first sense current, first value, second sense current, and second value.

15. The electronic device of claim 12, wherein the first, second, and third power modules are configured to drive corresponding different external loads.

16. The electronic device of claim 12, wherein the power transistor assumes a multi-finger transistor layout.

17. The electronic device of claim 12, wherein the derived sense signal is proportional to the drive current.

18. The electronic device of claim 12, wherein a distance between the first position and the central axis is about equal to a distance between the second position and the central axis.

19. The electronic device of claim 12, wherein a distance between the first position and the central axis is different than a distance between the second position and the central axis.

20. A method of forming an integrated circuit, comprising:
  locating a plurality of power modules on a substrate, including a first power module located between second and third power modules, wherein the first power module comprises a power transistor configured to conduct a load current;
  determining a first position within the first power module at which a first voltage is induced by a current through the second power module;
  determining a second position within the first power module at which a second voltage is induced by a current through the second power module;
  locating at the first position a first sense transistor configured to conduct a first sense current indicative of the load current; and
  locating at the second position a second sense transistor configured to conduct a second sense current indicative of the load current.

\* \* \* \* \*